(12) United States Patent  (10) Patent No.: US 6,847,567 B2
Kang  (45) Date of Patent: Jan. 25, 2005

(54) SENSE AMPLIFIER DRIVE CIRCUITS RESPONSIVE TO PREDECODED COLUMN ADDRESSES AND METHODS FOR OPERATING THE SAME

(75) Inventor: Kyung-Woo Kang, Kyounggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/361,320

(22) Filed: Feb. 10, 2003

(65) Prior Publication Data

US 2004/0037140 A1 Feb. 26, 2004

(30) Foreign Application Priority Data

Aug. 21, 2002 (KR) ................................ 10-2002-0049366

(51) Int. Cl.[7] .................................................. G11C 7/00
(52) U.S. Cl. ................... 365/205; 365/207; 365/230.06
(58) Field of Search ................................ 365/205, 207, 365/230.06

(56) References Cited

U.S. PATENT DOCUMENTS

| | | | | |
|---|---|---|---|---|
| 5,469,392 A | * | 11/1995 | Ihara | 365/205 |
| 5,691,943 A | * | 11/1997 | Yun | 365/189.05 |
| 5,930,197 A | * | 7/1999 | Ishibashi et al. | 365/203 |
| 6,128,213 A | * | 10/2000 | Kang | 365/145 |
| 6,144,596 A | * | 11/2000 | Ahn | 365/191 |
| 6,404,688 B2 | * | 6/2002 | Okuyama et al. | 365/222 |
| 6,552,954 B2 | * | 4/2003 | Fujisawa et al. | 365/207 |

* cited by examiner

*Primary Examiner*—Huan Hoang
(74) *Attorney, Agent, or Firm*—Myers Bigel Sibley & Sajovec (57) ABSTRACT

Sense amplifier drive circuits drive a sense amplifier in a semiconductor (integrated circuit) memory device. A sense amplifier drive signal generator is configured to generate a sense amplifier drive signal responsive to at least one predecoded column address received at an input thereof. The sense amplifier drive signal generator may receive predecoded column addresses from a column predecoder. A delay circuit coupled to the sense amplifier drive signal generator may delay the sense amplifier drive signal by a selected time and output a delayed sense amplifier drive signal for driving the sense amplifier. The selected time may be based on a time from activation of a bit line selection signal of the semiconductor (integrated circuit) memory device to application of selected data to the sense amplifier. Corresponding methods are also provided.

28 Claims, 9 Drawing Sheets

SENSE AMPLIFIER DRIVE CIRCUITS RESPONSIVE TO PREDECODED COLUMN ADDRESSES AND METHODS FOR OPERATING THE SAME

RELATED APPLICATION

This application claims priority to Korean-Patent Application 2002-49366, filed on Aug. 21, 2002, the contents of which are herein incorporated by reference in their entirety.

BACKGROUND OF THE INVENTION

The present invention relates to semiconductor memory devices, and more particularly, to sense amplifier drive circuits for semiconductor memory devices.

Various random access semiconductor (integrated circuit) memory devices may be characterized as a static random access memory (SRAM) or a dynamic random access memory (DRAM). A memory cell of a DRAM may be fabricated more easily than a memory cell of a SRAM, which may be particularly beneficial in the manufacture of increasingly dense and reduced size semiconductor memory devices. To improve the reading and writing speed of data from a DRAM, the DRAM may be operated synchronously to a system clock of a circuit including the DRAM, such as provided by a circuit board on which the DRAM is mounted.

Such a random access memory device operating synchronously to the system clock is generally referred to as a S-DRAM(Synchronous Dynamic Random Access Memory). An S-DRAM typically synchronizes to the system clock to provide a reference in initiating various operations, such as data read/write operations. Various commands related to performance of functions of the S-DRAM are also generally input and output synchronously to the system clock. The input/output operations may, for example, be performed responsive to a leading edge or a trailing edge of the system clock, depending on the design of the S-DRAM.

For an S-DRAM, external signals applied from outside of the S-DRAM chip typically synchronize to the system clock. However, internal circuit(s) can be divided into a synchronous part, operating synchronous to the external clock, and an asynchronous part. The synchronous part may be further subdivided into a portion synchronizing to an external system clock applied from outside the DRAM and a portion synchronizing to an internal clock generated internal to the DRAM. For example, row address decoding, activation of a selected word line, bit line sensing and the like generally do not synchronize to the external system clock. Data input/output operations of the DRAM are generally synchronized to the external system clock.

Figure 1:
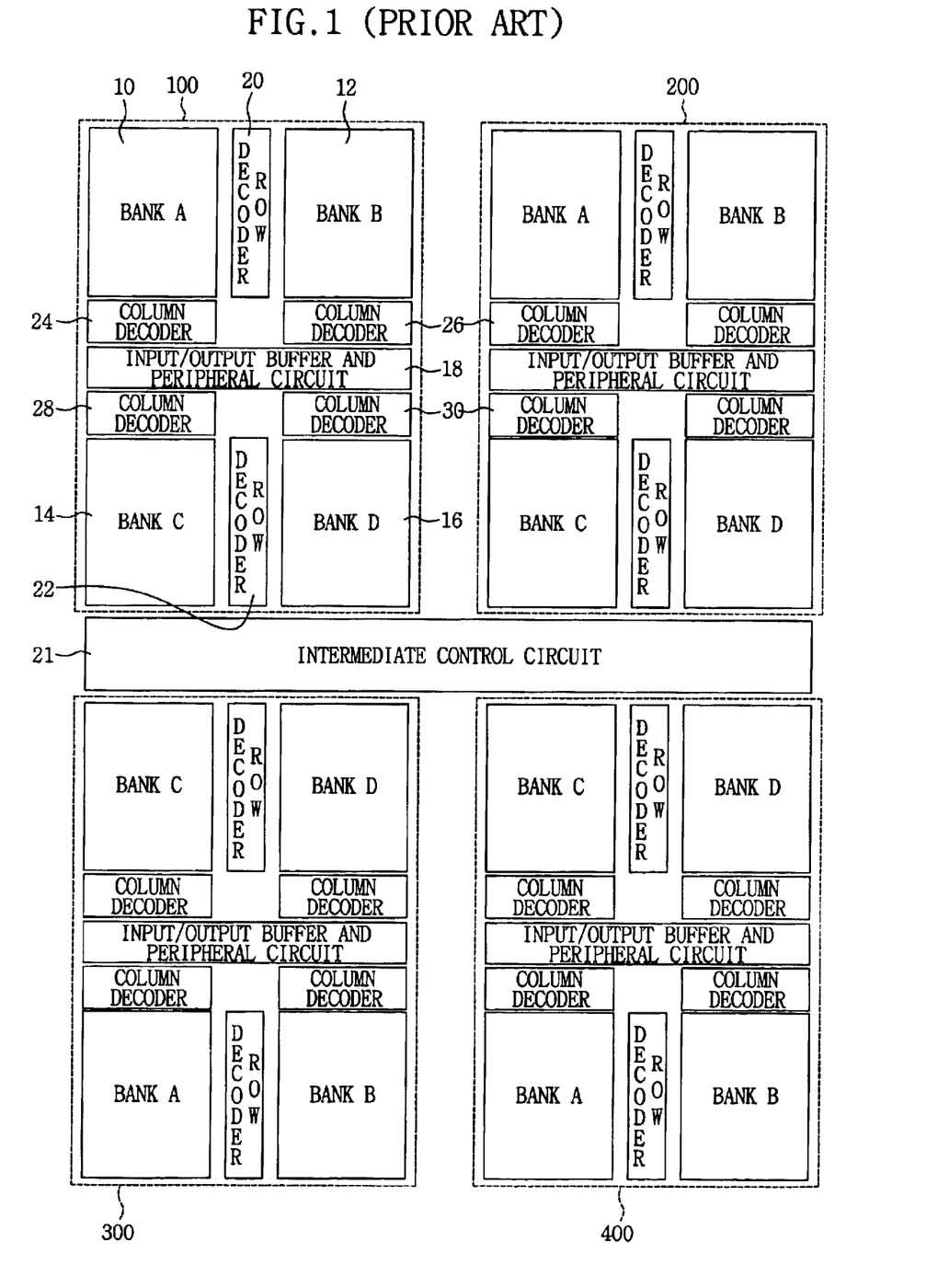
FIG. 1 is a block diagram illustrating the layout of a conventional semiconductor memory device.

FIG. 1 schematically illustrates the layout of a typical semiconductor memory device. A typical semiconductor memory device has a plurality of bit cells, such as memory cells, and a plurality of sense amplifiers for sensing and amplifying data through bit lines that are connected to the bit cells in a read operation. The sense amplifiers are generally driven by a sense amplifier driver circuit, which receives external clock signals and generates a sense amplifier-driving signal. As shown in FIG. 1, the semiconductor memory device includes four banks A, B, C, D (10, 12, 14, 16) that are arrayed in column and row relationship. Each of the memory banks A, B, C, D (10, 12, 14, 16) contains memory cells that are arrayed in column and row relationship. The memory cells store data, which may take a logic state of '1' or '0'. A row decoder 20 is disposed between the bank A 10 and the bank B 12 on the same row and a row decoder 22 is disposed between the bank C 14 and the bank D 16, which share a common row, different from the row of banks A, B 10, 12. It is to be understood that a number of rows within a memory bank will generally be associated with each row of memory banks.

Column decoders 24, 28 are positioned opposite each other between the bank A 10 and the bank C 14 on the same column. The column decoders 24, 28 generally contain a plurality of decoders. Similarly, the column decoders 26, 30 are positioned opposite each other between the bank B 12 and the bank D 16 on a shared column, different from the column of the column decoders 24, 28. As with the rows, it is to be understood that a number of columns within a memory bank will generally be associated with each column of memory banks.

An input/output buffer and peripheral circuit 18 is disposed between the column decoders 24, 28 and also between the column decoders 26, 30. For the semiconductor memory device illustrated in FIG. 1, the four memory banks A, B, C, D (10, 12, 14, 16) constitute one bank group. An intermediate control circuit 21 is positioned between the memory bank groups 100, 200 and the memory bank groups 300, 400. The intermediate control circuit 21 may include, for example, a clock signal generator that generates various internal clock signals.

Figure 2:
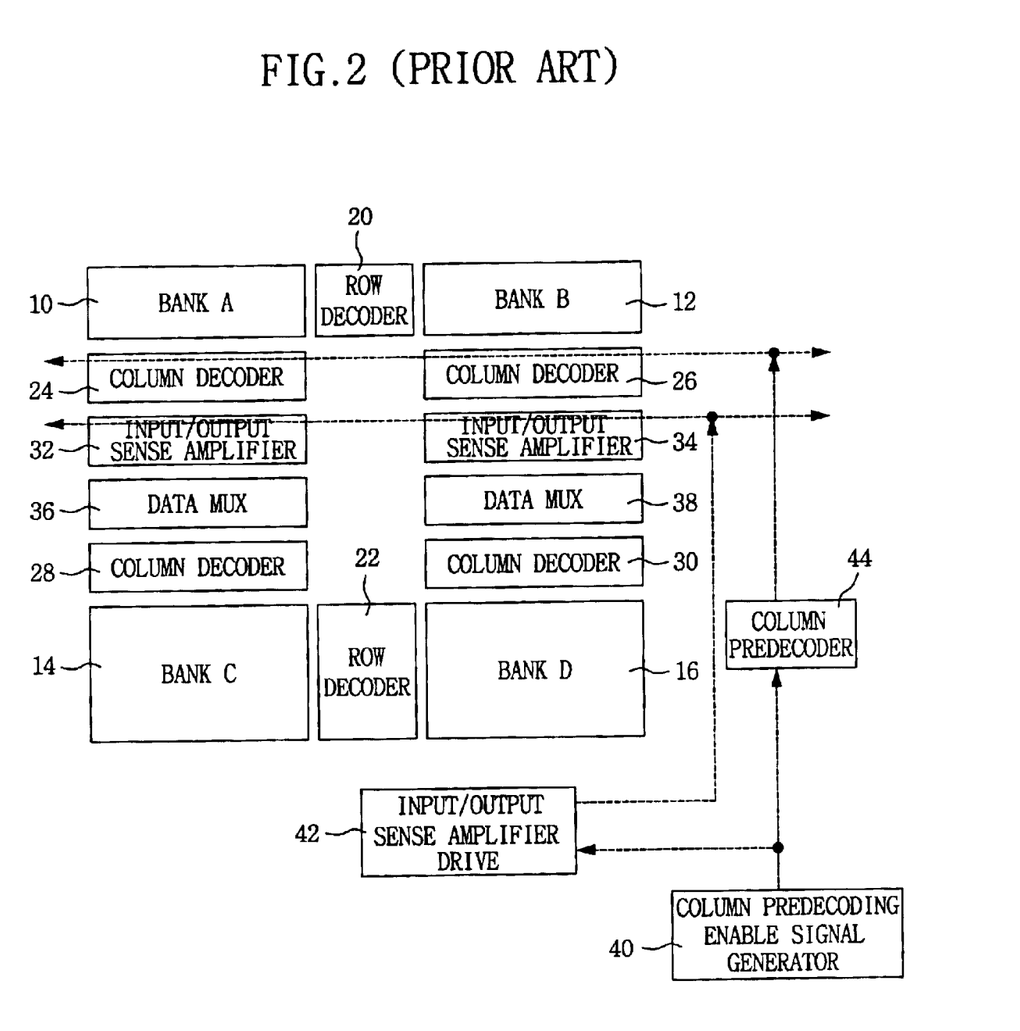
FIG. 2 is a block diagram illustrating the layout of further aspects of the conventional semiconductor memory device of FIG. 1.

FIG. 2 is a schematic block diagram illustration of the layout of a semiconductor memory device, such as illustrated in FIG. 1, including various details related to driving an input/output sense amplifier. As with FIG. 1, four memory banks A, B, C, D (10, 12, 14, 16) are illustrated arrayed in column and row relationship. A row decoder 20 is positioned between the bank A 10 and the bank B 12 on the same memory bank row and a row decoder 22 is positioned between the bank C 14 and the bank D 16 on another common memory bank row. Column decoders 24, 28 are positioned opposite to each other between the bank A 10 and the bank C 14 on the same memory bank column and column decoders 26, 30 are positioned opposite to each other between the bank B 12 and the bank D 16 on another common memory bank column.

FIG. 2 further illustrates an array including an input/output sense amplifier 32 and a data multiplexer(MUX) 36 that may be formed as two layers and be separately disposed between the column decoders 24, 28. Also shown in FIG. 2 are an input/output sense amplifier 34 and a data MUX 38 that may be provided as two layers respectively arrayed between the column decoders 26, 30.

The circuit of FIG. 2 also shows: a column predecoding enable signal generator 40 that receives an external clock signal and a command decoding signal and generates a column predecoding enable signal; an input/output sense amplifier drive 42 that generates an input/output sense amplifier drive signal FRP(First Read Pulse); and a column predecoder 44 that receives the column predecoding enable signal and predecodes the signal. These circuits may be included, for example, in the intermediate control circuit 21.

Figure 3:
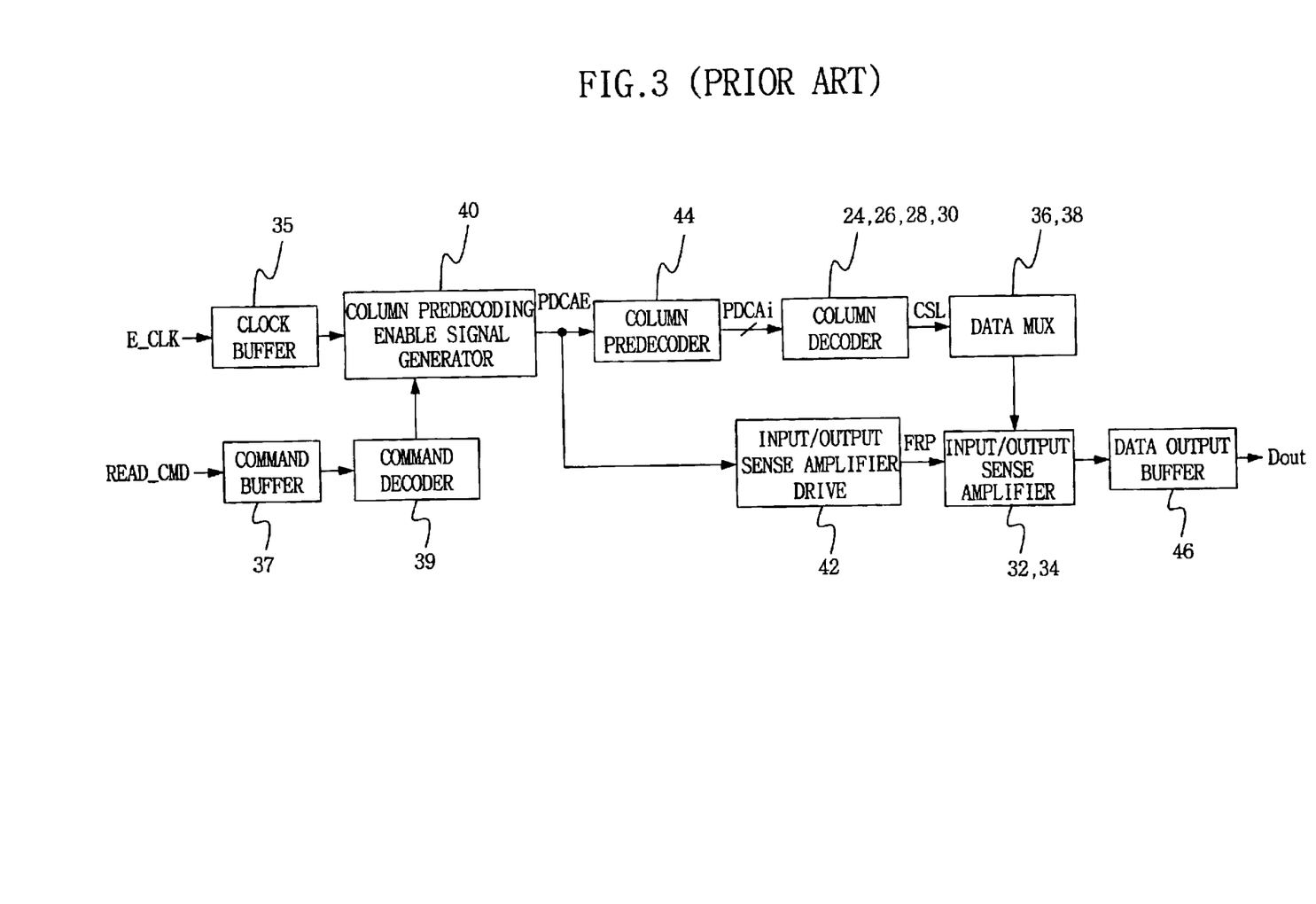
FIG. 3 is a block diagram illustrating further aspects of the conventional semiconductor memory device of FIG. 2.

FIG. 3 is a schematic block diagram illustration of a semiconductor memory device illustrating further aspects of driving the input/output sense amplifiers illustrated in FIG. 2. As illustrated in FIG. 3, to drive the input/output sense amplifiers of FIG. 2, a clock buffer 35 is provided for receiving, buffering and outputting an external clock. A command buffer 37 receives, buffers and outputs a read command READ_CMD. A command decoder 39 receives, decodes and outputs the read command output from the command buffer 37. A column predecoding enable signal generator 40 receives the external clock signal output from the clock buffer 35 and a command decoding signal decoded by the command decoder 39, and generates a column predecoding enable signal PDCAE. A column predecoder 44 receives the column predecoding enable signal PDCAE output from the column predecoding enable signal generator 40 and predecodes a column address. The column decoders 24, 26, 28, 30 receive and decode the column addresses PDCAi predecoded by the column predecoder 44 and output bit line selection signal(s) CSL(Column Select Line). An input/output sense amplifier drive 42 receives the column predecoding enable signal PDCAE output from the column predecoding enable signal generator 40 and generates and outputs an input/output sense amplifier drive signal FRP (First Read Pulse). The data MUXs 36, 38 receive the bit line selection signal(s) CSL output from the column decoders 24, 26, 28, 30 and selectively output data. The input/output sense amplifiers 32, 34 sense(amplify) and output the data selectively output from the data MUXs 36, 38 responsive to the input/output sense amplifier drive signal FRP output from the input/output sense amplifier drive 42. The data output buffer 46 buffers and outputs the data sensed by the input/output sense amplifiers 32, 34.

Figure 4:
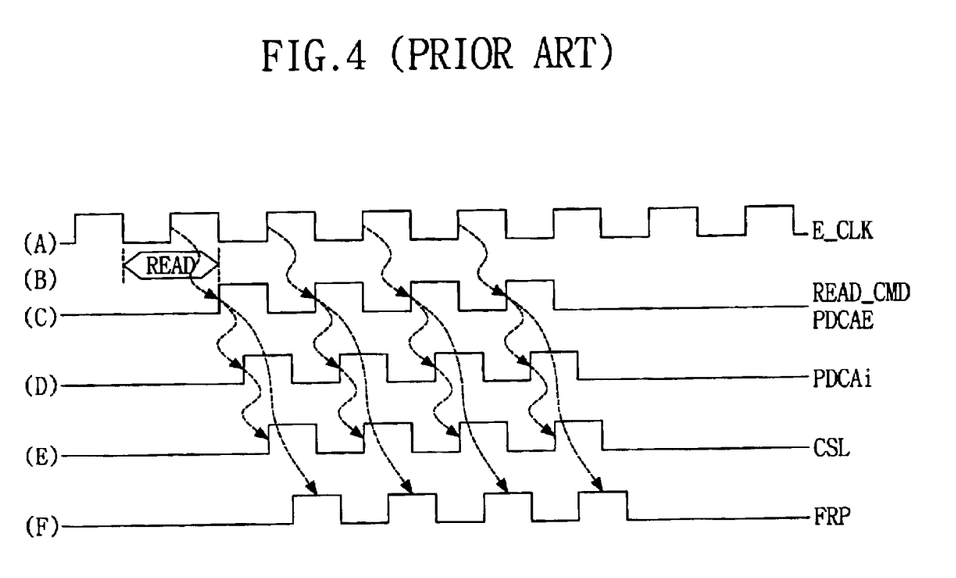
FIG. 4 is a timing diagram illustrating operations related to driving of an input/output sense amplifier of the semiconductor memory device of FIG. 3.

FIG. 4 is a timing diagram illustrating operations related to driving the input/output sense amplifiers of FIG. 3. The conventional operations for generating the input/output sense amplifier drive signal FRP and outputting data will now be described with reference to FIGS. 3 and 4. The clock buffer 35 receives and buffers the external clock and outputs an external clock signal E_CLK, as shown in FIG. 4 at row (A), to the column predecoding enable signal generator 40. The command buffer 37 receives, buffers and outputs the read command READ_CMD, as shown in FIG. 4 at row (B), to the command decoder 39. The command decoder 39 decodes the read command and applies it to the column predecoding enable signal generator 40. The column predecoding enable signal generator 40 receives the external clock signal E_CLK from the clock buffer 35 and the command decoding signal decoded by the command decoder 39 and generates the column predecoding enable signal PDCAE, shown in FIG. 4 at row (C). The signal PDCAE is applied to the column predecoder 44 and the input/output sense amplifier drive 42, as shown by the two dotted lines extending from the leading edge of the PDCAE signal as illustrated at row (C).

The column predecoder 44 receives the column predecoding enable signal PDCAE from the column predecoding enable signal generator 40, predecodes the column address, and applies the predecoded column addresse(s) PDCAi, as shown in FIG. 4 at row (D), to the column decoders 24, 26, 28, 30. The column decoders 24, 26, 28, 30 receive and decode the predecoded column addresses PDCAi from the column predecoder 44 and apply the bit line selection signal(s) CSL as shown in FIG. 4 at row (E), to the data MUXs 36, 38.

The input/output sense amplifier drive 42 receives the column predecoding enable signal PDCAE from the column predecoding enable signal generator 40 and generates the input/output sense amplifier drive signal(s) FRP(First Read Pulse), as shown in FIG. 4 at row (F). FRP is applied to each of the input/output sense amplifiers 32, 34. The input/output sense amplifiers 32, 34 sense the data selectively output (addressed) from the data MUXs 36, 38 individually in response to the input/output sense amplifier drive signals FRP from the input/output sense amplifier drive 42. The sensed (amplified) data is provided to the data output buffer 46. The data output buffer 46 buffers and outputs the data sensed by the input/output sense amplifier 32, 34.

For the conventional operations described with reference to FIGS. 3 and 4, when reading data, the input/output sense amplifiers 32, 34 are generally not driven unless data is already loaded on a secondary data line(s) from a memory cell that is selectively connected to the input/output sense amplifiers 32, 34 through input/output lines after generation of the bit line selection signal CSL (i.e., after selection/addressing of the cell). In addition, different signal paths are provided to receive the read command and generate the bit line selection signal CSL and to receive the read command and generate the input/output sense amplifier drive signal FRP. As a result, a delay time interval between the bit line selection signal CSL and the input/output sense amplifier drive signal FRP generally cannot be uniformly maintained. This may cause a corresponding delay margin to be varied and may result in signal skew.

Moreover, as the input/output sense amplifier drive 42 is generally located in the intermediate control circuit 21, the routing length of the input/output sense amplifier drive signal FRP between the input/output sense amplifier drive 42 and the input/output sense amplifiers 32, 34 may be lengthened. Such a lengthened routing length of the input/output sense amplifier drive signal FRP may cause a speed delay and/or increased consumption of power if repeaters are used in the routing, so that toggling may not be executed effectively at high frequencies.

SUMMARY OF THE INVENTION

In some embodiments of the present invention, sense amplifier drive circuits drive a sense amplifier in a semiconductor (integrated circuit) memory device. A sense amplifier drive signal generator is configured to generate a sense amplifier drive signal responsive to at least one predecoded column address received at an input thereof. The sense amplifier drive signal generator may receive predecoded column addresses from a column predecoder. A delay circuit coupled to the sense amplifier drive signal generator may delay the sense amplifier drive signal by a selected time and output a delayed sense amplifier drive signal for driving the sense amplifier. The selected time may be based on a time from activation of a bit line selection signal of the semiconductor memory device to application of selected data to the sense amplifier.

In further embodiments of the present invention, the sense amplifier drive signal generator is configured to provide a Boolean OR operation or an inverting Boolean OR operation. The delay circuit may be a variable delay circuit that delays the sense amplifier drive signal by a selected time responsive to a mode register set signal and/or a fuse option signal. The delay circuit may include a plurality of inverters. The drive circuit may also include an inverter coupled to the delay circuit that inverts the delayed sense amplifier drive signal.

In other embodiments of the present invention, circuits for driving of a sense amplifier in a semiconductor memory device are provided including a column predecoding enable signal generator that receives an external clock signal and a command decoding signal and generates a column predecoding enable signal. A column predecoder receives the column predecoding enable signal and predecodes a column address. A sense amplifier drive circuit receives the predecoded column address and generates a sense amplifier drive signal.

In further embodiments of the present invention, a plurality of column decoders associated with a memory bank group receive and decode the predecoded column address and output bit line selection signals. A plurality of data multiplexers(MUX) associated with the memory bank group receive the bit line selection signals and selectively output data responsive to the bit line selection signals. A plurality of sense amplifiers associated with the memory bank group amplify the output data from the plurality of data MUXs responsive to the sense amplifier drive signal. The sense amplifier drive circuit may be a shared sense amplifier drive circuit associated with the plurality of sense amplifiers and the plurality of column decoders. Alternatively, the sense amplifier drive circuit may be a plurality of sense amplifier drive circuits coupled between ones of the column decoders and ones of the sense amplifiers.

In other embodiments of the present invention, the sense amplifier drive circuit includes a sense amplifier drive signal generator receives the predecoded column address and generates the sense amplifier drive signal. A delay circuit coupled to the sense amplifier drive signal generator delays the sense amplifier drive signal by a selected time and outputs a delayed sense amplifier drive signal for driving the sense amplifier. One or more memory banks are associated with the sense amplifier.

In further embodiments of the present invention, methods provide for controlling a driving of input/output sense amplifier in a semiconductor memory device. An external clock signal and a command decoding signal are received and a column predecoding enable signal is generated. A column address is predecoded responsive to the column predecoding enable signal. A sense amplifier drive signal is generated responsive to the predecoded column address.

In other embodiments of the present invention, the method further includes decoding the predecoded column addresses to provide bit line selection signal(s). Data is selectively output responsive to the bit line selection signal(s). The selectively outputted data is sensed responsive to the sense amplifier drive signal. Generating the sense amplifier drive signal may include generating a delayed sense amplifier drive signal delayed by a selected delay time relative to receipt of the predecoded column address.

DETAILED DESCRIPTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. Signal lines, and signals thereon, may be referred to herein by the same reference characters and names. It will be understood that when an element is referred to as being "connected to" or "coupled to" another element, it can be directly connected to or coupled to the other element or intervening elements may also be present. In contrast, when an element is referred to as being "directly connected" or "directly coupled" to another element, there are no intervening elements present. Moreover, each embodiment described and illustrated herein includes its complementary logic type embodiment as well.

Figure 5:
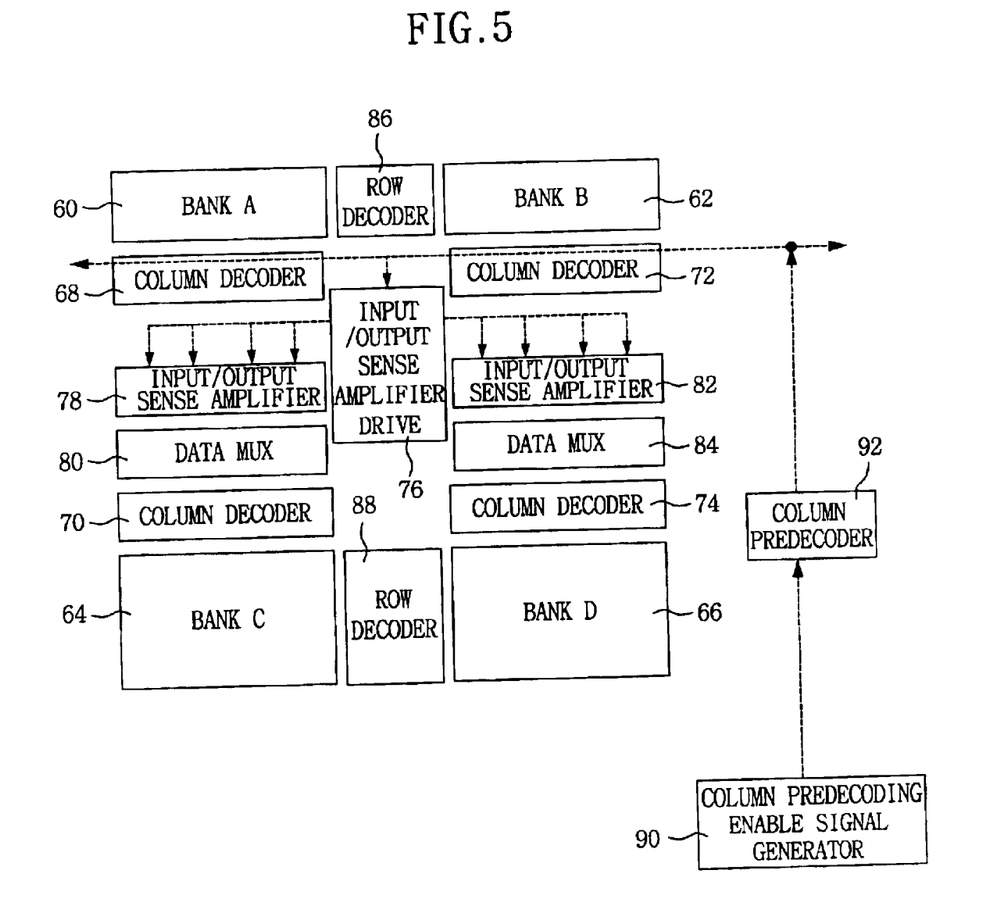
FIG. 5 is a block diagram illustrating the layout of a semiconductor memory device including an input/output sense amplifier circuit according to some embodiments of the present invention.

The present invention will now be further described with reference to the embodiments illustrated in FIGS. 5–11. FIG. 5 is schematic diagram illustrating the layout of a semiconductor memory device including a sense amplifier drive circuit configured to drive an input/output sense amplifier in accordance with some embodiments of the present invention. As shown in FIG. 5, four memory banks A, B, C, D (60, 62, 64, 66) are arrayed in a column and row relationship. A row decoder 86 is positioned between the bank A 60 and the bank B 62 in one memory bank row and a row decoder 88 is positioned between the bank C 64 and the bank D 66 on another memory bank row.

The column decoders 68, 70 are opposite each other between the bank A 60 and the bank C 64 on one memory bank column. An input/output sense amplifier 78 and a data MUX(multiplexer) 80 are respectively arrayed between the column decoders 68, 70. The column decoders 72, 74 are arrayed opposite each other between the bank B 62 and the bank D 66 on one memory bank column with an input/output sense amplifier 82 and a data MUX 84 arrayed between the column decoders 72, 74.

An input/output sense amplifier drive 76 for generating an input/output sense amplifier drive signal (FRP: First Read Pulse) is located in a central portion of the device between the column decoders 68, 72 and the input/output sense amplifiers 78, 82. An intermediate control circuit may include the column predecoding enable signal generator 90 that receives an external clock signal and a command decoding signal and generates a column predecoding enable signal. The intermediate control circuit may also include a column predecoder 92 that receives and predecodes the column predecoding enable signal.

Figure 6:
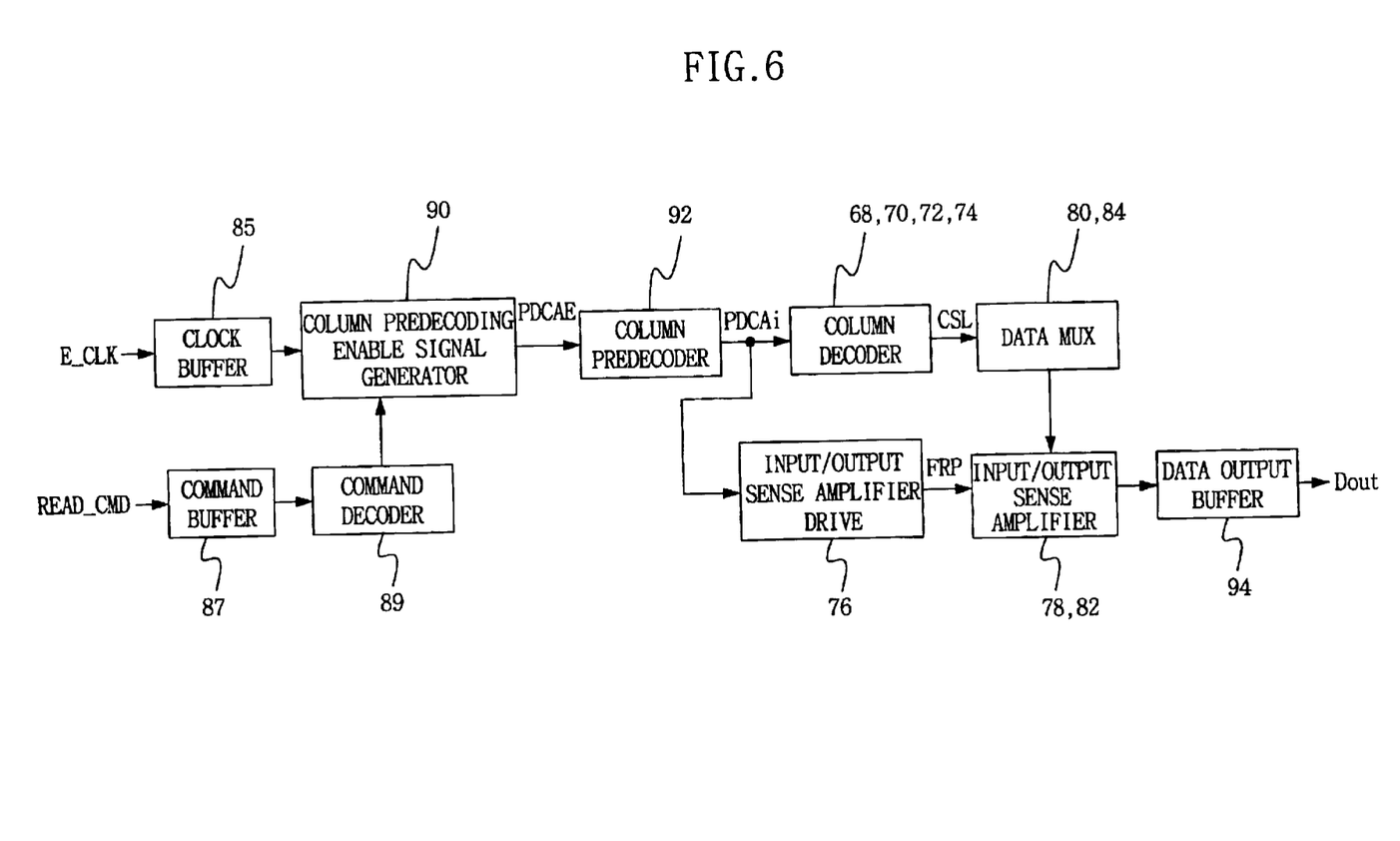
FIG. 6 is a block diagram illustrating further aspects of the semiconductor memory device of FIG. 5 according to some embodiments of the present invention.

The sense amplifier drive circuit of the present invention will now be further described with reference to the embodiments illustrated in FIG. 6. FIG. 6 is a block diagram illustrating a semiconductor memory device including a sense amplifier drive circuit. Certain aspects of the memory device, not illustrated in FIG. 6, may be provided, for example, substantially as illustrated in FIG. 5. As shown in FIG. 6, the semiconductor memory device includes a clock buffer 85 for receiving, buffering and outputting an external clock. A command buffer 87 receives, buffers and outputs a read command READ_CMD. A command decoder 89 receives, decodes and outputs the read command READ_CMD from the command buffer 87. A column predecoding enable signal generator 90 receives the external clock signal from the clock buffer 85 and a command decoding signal decoded by the command decoder 89 and generates a column predecoding enable signal PDCAE. A column predecoder 92 receives the column predecoding enable signal PDCAE from the column predecoding enable signal generator 90 and generates a predecoded column address PDCAi. The column decoders 68, 70, 72, 74 receive and decode the column addresses PDCAi predecoded by the column predecoder 92 and outputs bit line selection signal(s) CSL(Column Select Line). The input/output sense amplifier drive circuit 76 receives the predecoded column addresses PDCAi from the column predecoder 92 and generates and outputs the input/output sense amplifier drive signal(s) FRP (First Read Pulse). The data MUXs 80, 84 receive the bit line selection signal(s) CSL from the column decoders 68, 70, 72, 74 and selectively outputs data. The input/output sense amplifiers 78, 82 sense (amplify) and output the selected data from the data MUXs 80, 84, respectively, responsive to the input/output sense amplifier drive signal(s) FRP. A data output buffer 94 buffers and outputs the data sensed by the input/output sense amplifiers 78, 82.

Figure 7:
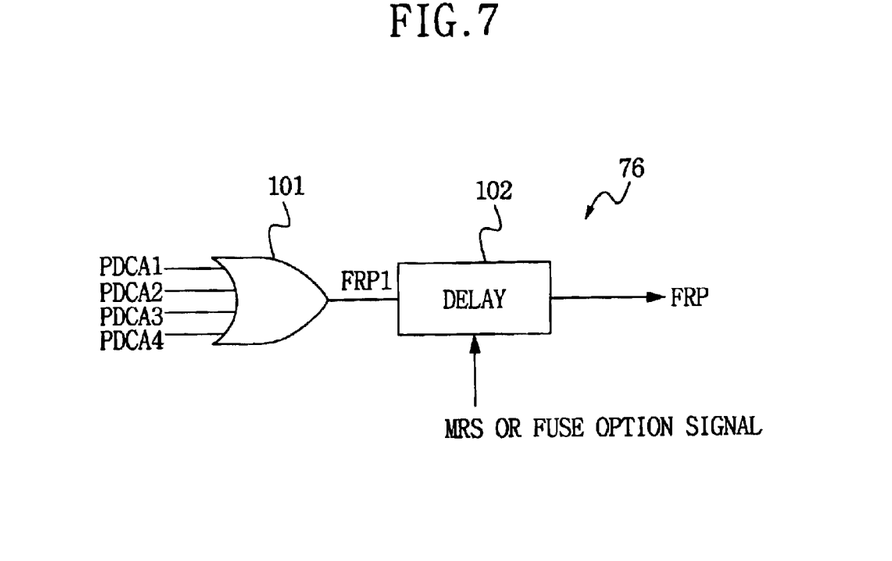
FIG. 7 is a circuit diagram illustrating an input/output sense amplifier drive circuit according to some embodiments of the present invention suitable for use in the semiconductor memory device of FIG. 5.

FIG. 7 is a circuit diagram illustrating an input/output sense amplifier drive circuit 76 suitable for use in the circuit of FIG. 5 according to some embodiments of the present invention. As shown in FIG. 7, the input/output sense amplifier drive circuit 76 includes an OR gate 101 that provides a Boolean OR operation on the received predecoded column addresses PDCA1~PDCA4 (four shown in FIG. 7 for illustration purposes) from the column predecoder 92 to generate input/output sense amplifier drive signal(s) FRP1. It is to be understood that Boolean equivalents to an OR gate may be used in accordance with such embodiments of the present invention. A delay circuit 102 delays, by a selected time, the input/output sense amplifier drive signals FRP1 generated by the OR gate 101 and outputs the delayed sense amplifier drive signals FRP. More particularly, for the embodiments illustrated in FIG. 7, an externally adjustable delay is provided by setting the delay of delay circuit 102 responsive to, for example, a mode register set signal MRS or a fuse option signal.

Figure 8:
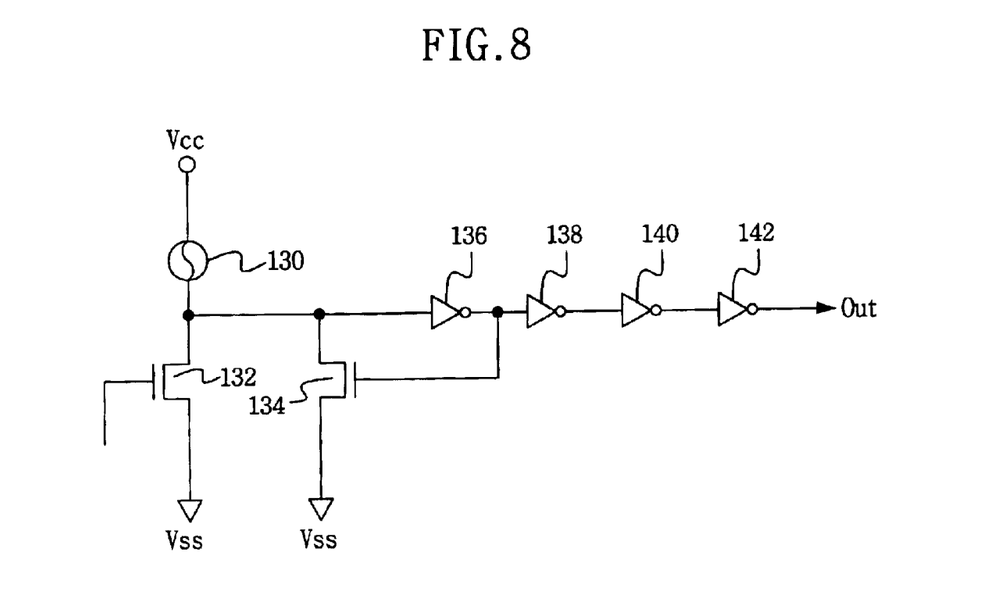
FIG. 8 is a circuit diagram illustrating a fuse option circuit for generating a fuse option signal according to some embodiment of the present invention.

FIG. 8 is a circuit diagram illustrating a fuse option for generating a fuse option signal that may be applied to the delay circuit 102 of FIG. 7 according to some embodiments of the present invention. As shown in FIG. 8, the circuit includes a fuse 130, NMOS transistors 132, 134, and inverters 136, 138, 140, 142. The NMOS transistor gate input may be a reference voltage to provide, for example, a low current flow to drop the voltage when the fuse 130 is burned to disconnect the Vcc signal.

Figure 9:
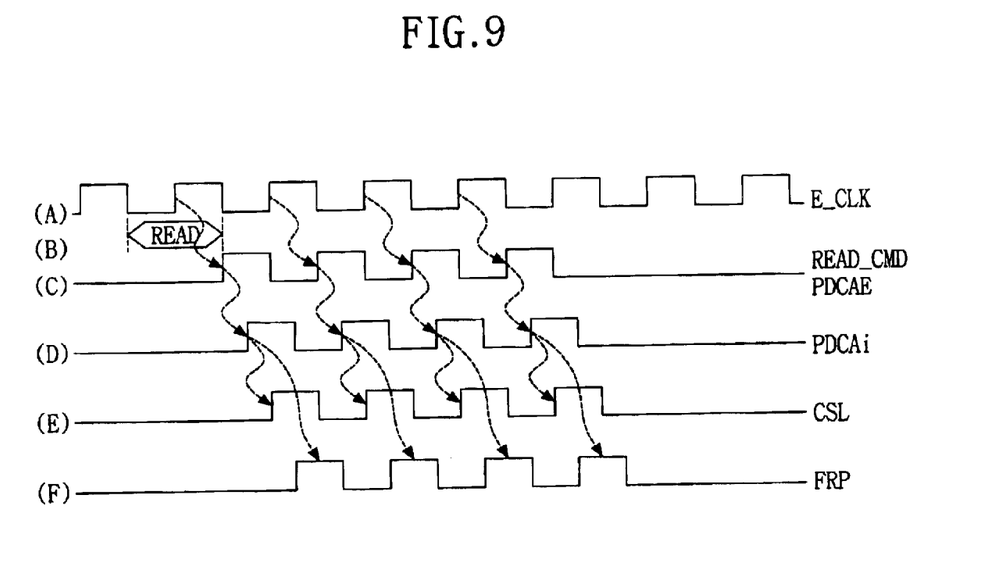
FIG. 9 is a timing diagram showing operations related to driving an input/output sense amplifier according to some embodiments of the present invention.

FIG. 9 is a timing diagram illustrating operations related to driving of a sense amplifier of a semiconductor memory device according to various embodiments of the present invention. Operations according to some embodiments of the present invention will now be described with reference to FIGS. 6 and 9. The clock buffer 85 receives and buffers the external clock, and outputs an external clock signal E_CLK, as shown at row (A) of FIG. 9, to the column predecoding enable signal generator 90. The command buffer 87 receives and buffers a read command READ_CMD, as shown at row (B) of FIG. 9, and outputs it to the command decoder 89. The command decoder 89 decodes the read command and applies it to the column predecoding enable signal generator 90. The column predecoding enable signal generator 90 receives the external clock signal E_CLK from the clock buffer 85 and the command decoding signal decoded by the command decoder 89 and generates a column predecoding enable signal PDCAE, as shown in row (C) of FIG. 9. The signal PDCAE is provided to the column predecoder 92.

The column predecoder 92 receives the column predecoding enable signals PDCAE from the column predecoding enable signal generator 90 and predecodes column addresses PDCAi, as shown in row (D) of FIG. 9. The predecoded column addresses PDCAi are applied to the column decoders 68, 70, 72, 74 and to the sense amplifier drive circuit 76.

The column decoders 68, 70, 72, 74 receive and decode the predecoded column addresses PDCAi from the column predecoder 92 and apply the bit line selection signal(s) CSL, as shown in row (E) of FIG. 9, to the data MUXs 80, 84. The data MUXs 80, 84 select the data (i.e., the addressed data) in response to the bit line selection signal(s) CSL from the column decoders 68, 70, 72, 74 and apply the data to the input/output sense amplifiers 78, 82. The input/output sense amplifier drive circuit 76 receives the predecoded column addresses PDCAi from the column predecoder 92 and generates the input/output sense amplifier drive signal(s) FRP, as shown in row (F) of FIG. 9. The signal(s) FRP is applied to the input/output sense amplifiers 78, 82.

The input/output sense amplifiers 78, 82 sense data selected by the data MUXs 80, 84 individually responsive to the input/output sense amplifier drive signal(s) FRP from the input/output sense amplifier drive circuit 76 and apply the signals to the data output buffer 94. The data output buffer 94 buffers and outputs the data sensed by the input/output sense amplifiers 78, 82.

The input/output sense amplifier drive circuit 76 may be configured, for example, as shown in FIG. 7. The predecoded column addresses PDCAi (namely, the predecoded column addresses PDCA1~PDCA4) may then be individually applied to the OR gate 101. The OR gate 101 provides a Boolean OR (logical sum) operation to the predecoded column addresses PDCA1~PDCA4 and generates an input/output sense amplifier signal FRP1. In other words, when any one address among the predecoded column addresses PDCA1~PDCA4 is activated (generated), the input/output sense amplifier drive signal FRP1 is generated.

The sense amplifier drive signal FRP1 is applied to the delay circuit 102. The delay circuit 102 delays, for a designated time, the input/output sense amplifier drive signal FRP1 generated by the OR gate 101, and then, when a mode register set signal MRS or a fuse option signal is applied, the delay 102 is enabled so as to apply the held sense amplifier drive signal FRP to the input/output sense amplifiers 78, 82 to drive the input/output sense amplifiers 78, 82. A delay time of the delay 102 may, thereby, be variably determined by the mode register set signal MRS or the fuse option signal.

When data selected by the data MUXs 80, 84 is applied to the input/output sense amplifiers 78, 82 after generation of the bit line selection signal(s) CSL from the column decoders 68, 70, 72, 74, the delay circuit 102 receives the mode register set MRS or the fuse option signal, and delays for a selected time the input/output sense amplifier drive signals FRP1 so as to drive the input/output sense amplifiers 78, 82. In other words, the selected delay time may be selected so that data is presented to the sense amplifiers before they are driven.

Referring now to FIG. 8, operations for controlling the delay time based on a fuse option signal will be further described for some embodiments of the present invention. When the fuse 130 is not cut off, a source voltage Vcc is output as a high signal through the inverters 136, 138, 140, 142 and the delay 102 is not enabled. When the fuse 130 is cut off, a low signal is output through the inverters 136, 138, 140, 142 to enable the delay 102. When the delay 102 is enabled, the input/output sense amplifier drive signals FRP1 generated by the OR gate 101 are applied to the input/output sense amplifiers 78, 82. That is, the mode register set signal or the fuse option signal is a programmable signal. In other words, the delay time of the delay 102 can be varied through external programming.

Figure 10:
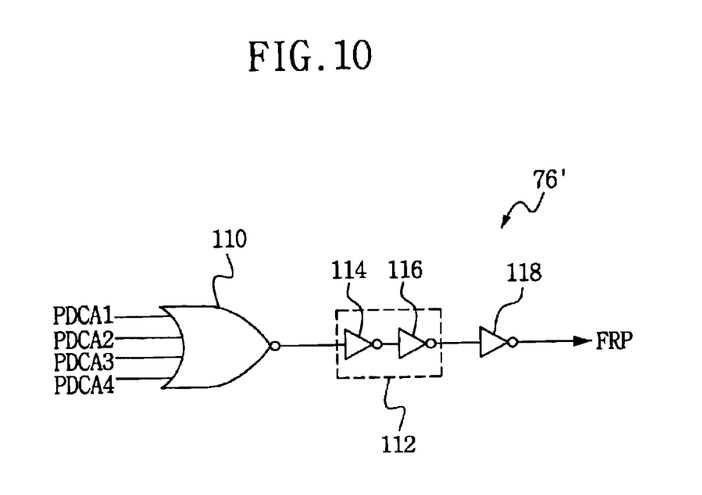
FIG. 10 is a circuit diagram illustrating an input/output sense amplifier drive circuit according to some embodiments of the present invention suitable for use in the semiconductor memory device of FIG. 5.

FIG. 10 is a circuit diagram illustrating a sense amplifier drive circuit 76' according to further embodiments of the present invention suitable for use as the input/output sense amplifier drive circuit 76 of FIG. 5. As shown in FIG. 10, the input/output sense amplifier drive circuit 76 includes a NOR gate 110 for providing an inverted Boolean OR operation (inverse logically summing) for the predecoded column addresses PDCA1~PDCA4 from the column predecoder 92 to generate the input/output sense amplifier drive signals FRP1. A delay circuit 112 includes two inverters 114, 116 and delays, by a constant time, the input/output sense amplifier drive signals FRP from the NOR gate 110 and outputs the delayed sense amplifier drive signals FRP. An inverter 118 outputs the inverted input/output sense amplifier drive signals FRP delayed by the delay 112.

More particularly, for the input/output sense amplifier drive 76 shown in FIG. 10, the predecoded column addresses PDCAi from the column predecoder 92, shown as predecoded column addresses PDCA1~PDCA4, are individually applied to the NOR gate 110. The NOR gate 110 (or its Boolean equivalent) provides an inverting Boolean OR operation on the predecoded column addresses PDCA1~PDCA4 and generates input/output sense amplifier signal(s) FRP. Thus, when one address among the predecoded column addresses PDCA1~PDCA4 is activated (generated), the input/output sense amplifier drive signal FRP1 is generated. The sense amplifier drive signal FRP1 is applied to the delay circuit 112. The input/output sense amplifier drive signal FRP1 generated by the NOR gate 110 is delayed for a selected time by a two (or more) inverters 114, 116 that define the delay circuit 112. The delayed sense amplifier drive signals FRP are inverted and output by the inverter 118 and applied to the input/output sense amplifiers 78, 82.

The delay circuit 112 delays the input/output sense amplifier drive signals FRP1, by a time that me be selected based on a time between the generation of the bit line selection signal(s) CSL from the column decoders 68, 70, 72, 74 and application of the data selected by the data MUXs 80, 84 to the input/output sense amplifiers 78, 82.

Figure 11:
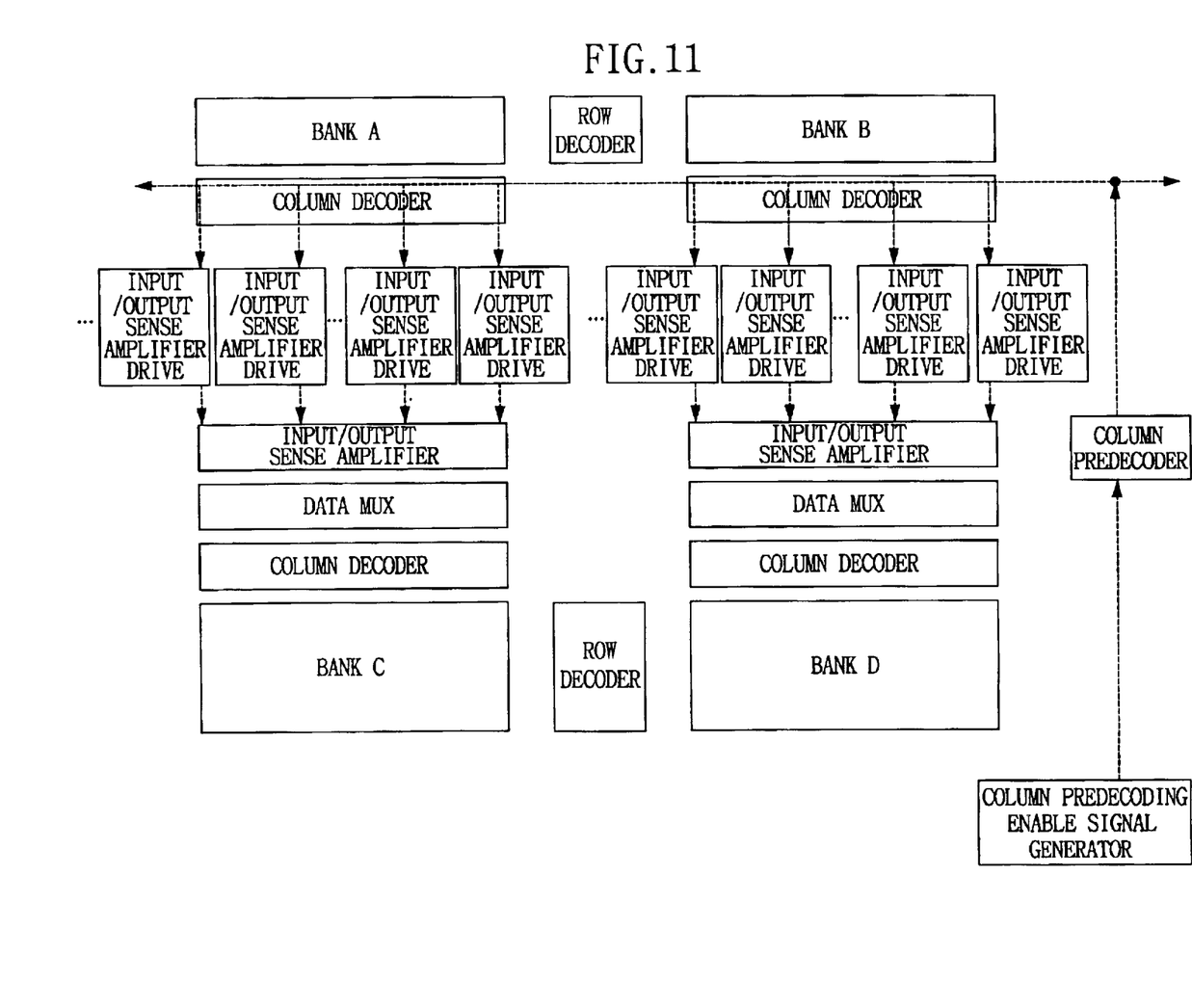
FIG. 11 is a block diagram illustrating the layout of a semiconductor memory device including a sense amplifier drive circuit to drive an input/output sense amplifier in accordance with other embodiments of the present invention.

Although the invention was described above with reference to a configuration including one input/output sense amplifier drive circuit disposed between column decoders and between sense amplifiers, as shown in FIG. 5, and to respectively output the input/output sense amplifier drive signals FRP from one input/output sense amplifier drive to the input/output sense amplifiers, the invention is not so limited. The present invention also includes embodiments, as illustrated in FIG. 11, having a plurality of input/output sense amplifier drives disposed between the column decoder and the input/output sense amplifier so as to drive the input/output sense amplifiers. In accordance with various embodiments of the present invention, a speed delay and a power consumption of a memory device may be improved by shortening a routing length of an input/output sense amplifier drive signal between an input/output sense amplifier drive circuit and an input/output sense amplifier. Data loss and skew may be reduced or even prevented by way of a substantially uniform margin between an input/output sense amplifier drive signal and a bit line selection signal.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A sense amplifier drive circuit for an integrated circuit memory device, comprising:
   a sense amplifier drive signal generator that is configured to generate a read pulse that drives a sense amplifier responsive to at least one predecoded column address received at an input thereof.

2. A sense amplifier drive circuit for an integrated circuit memory device, comprising:
   a sense amplifier drive signal generator that is configured to generate a sense amplifier drive signal responsive to at least one predecoded column address received at an input thereof, wherein the sense amplifier drive signal generator receives predecoded column addresses from a column predecoder and wherein the drive circuit further comprises a delay circuit coupled to the sense amplifier drive signal generator that delays the sense amplifier drive signal by a selected time and outputs a delayed sense amplifier drive signal for driving the sense amplifier.

3. The drive circuit of claim 2 wherein the selected time is based on a time from activation of a bit line selection signal of the integrated circuit memory device to application of selected data to the sense amplifier.

4. The drive circuit of claim 2 wherein the sense amplifier drive signal generator is configured to provide a Boolean OR operation.

5. The drive circuit of claim 4 wherein the delay circuit comprises a variable delay circuit that delays the sense amplifier drive signal by a selected time responsive to a mode register set signal and/or a fuse option signal.

6. The drive circuit of claim 2 wherein the sense amplifier drive signal generator is configured to provide an inverting Boolean OR operation.

7. The drive circuit of claim 6 wherein the delay circuit includes a plurality of inverters.

8. The drive circuit of claim 7 wherein the drive circuit further comprises an inverter coupled to the delay circuit that inverts the delayed sense amplifier drive signal.

9. A circuit for driving of a sense amplifier in a semiconductor memory device, the apparatus comprising:
   a column predecoding enable signal generator that receives an external clock signal and a command decoding signal and generates a column predecoding enable signal;
   a column predecoder that receives the column predecoding enable signal and predecodes a column address; and a sense amplifier drive circuit that receives the predecoded column address and generates a read pulse that drives the sense amplifier.

10. The circuit of claim 9 further comprising at least one memory bank associated with the sense amplifier.

11. The drive circuit of claim 9 further comprising a column decoder that receives the predecoded column address and generates a bit line selection signal.

12. A circuit for driving of a sense amplifier in a semiconductor memory device, the apparatus comprising:

a column predecoding enable signal generator that receives an external clock signal and a command decoding signal and generates a column predecoding enable signal;

a column predecoder that receives the column predecoding enable signal and predecodes a column address;

a sense amplifier drive circuit that receives the predecoded column address and generates a sense amplifier drive signal;

a plurality of column decoders associated with a memory bank group that receive and decode the predecoded column address and output bit line selection signals;

a plurality of data multiplexers(MUX) associated with the memory bank group that receive the bit line selection signals and selectively output data responsive to the bit line selection signals; and a plurality of sense amplifiers associated with the memory bank group that amplify the output data from the plurality of data MUXs responsive to the sense amplifier drive signal.

13. The circuit of claim 12 wherein the sense amplifier drive circuit comprises a shared sense amplifier drive circuit associated with the plurality of sense amplifiers and the plurality of column decoders.

14. The circuit of claim 12 wherein the sense amplifier drive circuit comprises a plurality of sense amplifier drive circuits coupled between ones of the column decoders and ones of the sense amplifiers.

15. A circuit for driving of a sense amplifier in a semiconductor memory device, the apparatus comprising:

a column predecoding enable signal generator that receives an external clock signal and a command decoding signal and generates a column predecoding enable signal;

a column predecoder that receives the column predecoding enable signal and predecodes a column address;

a sense amplifier drive circuit that receives the predecoded column address and generates a sense amplifier drive signal;

wherein the sense amplifier drive circuit comprises:

a sense amplifier drive signal generator that receives the predecoded column address and generates the sense amplifier drive signal; and a delay circuit coupled to the sense amplifier drive signal generator that delays the sense amplifier drive signal by a selected time and outputs a delayed sense amplifier drive signal for driving the sense amplifier.

16. The circuit of claim 15 wherein the selected time is based on a time from activation of a bit line selection signal of the semiconductor memory device to application of selected data to the sense amplifier.

17. The circuit of claim 15 wherein the sense amplifier drive signal generator is configured to provide a Boolean OR operation.

18. The circuit of claim 15 wherein the delay circuit comprises a variable delay circuit that delays the sense amplifier drive signal by a selected time responsive to a mode register set signal and/or a fuse option signal.

19. The circuit of claim 15 wherein the sense amplifier drive signal generator is configured to provide an inverting Boolean OR operation.

20. The circuit of claim 19 wherein the delay circuit comprises a plurality of inverters.

21. The circuit of claim 20 wherein the circuit for driving of a sense amplifier further comprises an inverter coupled to the delay circuit that inverts the delayed sense amplifier drive signal.

22. A method of controlling a driving of input/output sense amplifier in a semiconductor memory device, the method comprising:

receiving an external clock signal and a command decoding signal, and generating a column predecoding enable signal;

predecoding a column address responsive to the column predecoding enable signal; and generating a read pulse that drives the input/output sense amplifier responsive to the predecoded column address.

23. The method of claim 22, further comprising:

decoding the predecoded column addresses to provide at least one bit line selection signal;

selectively outputting data responsive to the at least one bit line selection signal; and sensing the selectively outputted data responsive to the sense amplifier drive signal.

24. The method of claim 22 further comprising generating a bit line selection signal responsive to the predecoded column address.

25. A method of controlling a driving of input/output sense amplifier in a semiconductor memory device, the method comprising:

receiving an external clock signal and a command decoding signal, and generating a column predecoding enable signal;

predecoding a column address responsive to the column predecoding enable signal; and generating a sense amplifier drive signal responsive to the predecoded column address including generating a delayed sense amplifier drive signal delayed by a selected delay time relative to receipt of the predecoded column address.

26. The method of claim 25 wherein the selected delay time comprises a variable delay time selected responsive to a mode register set signal and/or a fuse option signal.

27. The method of claim 25 wherein the selected time is based on a time from activation of a bit line selection signal of the semiconductor memory device to application of selected data to the sense amplifier.

28. A method of controlling a driving of input/output sense amplifier in a semiconductor memory device, the method comprising:

receiving an external clock signal and a command decoding signal, and generating a column predecoding enable signal;

predecoding a column address responsive to the column predecoding enable signal; and generating a sense amplifier drive signal responsive to the predecoded column address including performing a Boolean OR operation on the predecoded column address.

* * * * *